(12) United States Patent
Hsieh et al.

(10) Patent No.: US 8,453,716 B2
(45) Date of Patent: Jun. 4, 2013

(54) HEAT DISSIPATION DEVICE

(75) Inventors: Yi-Shih Hsieh, Taipei Hsien (TW);
Rui-Wen Sun, KunShan (CN)

(73) Assignees: Furui Precise Component (Kunshan) Co., Ltd., Kunshan (CN); Foxconn Technology Co., Ltd., New Taipei (TW)

( * ) Notice: Subject to any disclaimer, the term of this patent is extended or adjusted under 35 U.S.C. 154(b) by 367 days.

(21) Appl. No.: 12/832,948

(22) Filed: Jul. 8, 2010

(65) Prior Publication Data

US 2011/0297356 A1 Dec. 8, 2011

(30) Foreign Application Priority Data

Jun. 7, 2010 (CN) .......................... 2010 1 0193423

(51) Int. Cl.
*F28F 7/00* (2006.01)
*F28D 15/00* (2006.01)
*H05K 7/20* (2006.01)

(52) U.S. Cl.
USPC ..................... 165/80.3; 165/104.33; 361/700; 361/704

(58) Field of Classification Search
USPC ............... 165/80.3, 104.33, 151; 361/704, 361/700
See application file for complete search history.

(56) References Cited

U.S. PATENT DOCUMENTS

| | | | | | |
|---|---|---|---|---|---|
| 1,553,093 | A | * | 9/1925 | Modine | 165/151 |
| 2,216,778 | A | * | 10/1940 | Houdry | 165/182 |
| 2,790,628 | A | * | 4/1957 | Barnes | 165/180 |
| 4,928,756 | A | * | 5/1990 | Shull et al. | 165/182 |
| 5,467,816 | A | * | 11/1995 | Larinoff | 165/151 |
| 6,802,362 | B2 | * | 10/2004 | Wenger et al. | 165/104.33 |
| 6,860,321 | B2 | * | 3/2005 | Ji-Hai et al. | 165/80.3 |
| 7,120,026 | B2 | * | 10/2006 | Chen | 361/704 |
| 7,564,686 | B2 | * | 7/2009 | Wang et al. | 361/700 |
| 2002/0117295 | A1 | * | 8/2002 | Shen | 165/182 |
| 2003/0079862 | A1 | * | 5/2003 | Moore et al. | 165/80.3 |
| 2006/0070721 | A1 | * | 4/2006 | Chen | 165/80.3 |
| 2007/0284082 | A1 | * | 12/2007 | Sung | 165/80.3 |
| 2007/0284083 | A1 | * | 12/2007 | Sung | 165/80.3 |
| 2009/0151901 | A1 | * | 6/2009 | Hsiao | 165/80.3 |
| 2010/0025018 | A1 | * | 2/2010 | Chen | 165/104.33 |
| 2010/0157537 | A1 | * | 6/2010 | Yu et al. | 361/704 |

* cited by examiner

*Primary Examiner* — Brandon M Rosati
(74) *Attorney, Agent, or Firm* — Altis Law Group, Inc.

(57) ABSTRACT

An exemplary heat dissipation device includes a heat pipe and a fin unit. The heat pipe includes an evaporation section and a condensing section formed at opposite ends thereof, respectively. The fin unit includes plural stacked parallel fins. Each of the fins defines a through hole therein for receiving the condensing section of the heat pipe. A flange extends from a periphery of the through hole. The flange defines two slits to divide the flange into two separate portions. The slits communicate with the through hole. A compressible structure is formed in each fin at opposite sides of the through hole. The compressible structure is aligned with the slits such that when the fin is compressed along a direction transverse to the alignment, the compressible structure is compressed and the separate portions of the flange move toward each other and closely contact the condensing section of the heat pipe.

10 Claims, 5 Drawing Sheets

HEAT DISSIPATION DEVICE

BACKGROUND

1. Technical Field

The present disclosure relates to heat dissipation, and particularly to a heat dissipation device having a heat pipe.

2. Description of Related Art

With the continuing development of electronics technology, electronic components of electronic devices, such as central processing units (CPUs), memory modules, and video graphics array (VGA) chips, feature increasingly high operating speeds. Accordingly, these electronic components generate much heat, which needs to be dissipated immediately to ensure the continued proper functioning of the electronic device.

Generally, a heat dissipation device is provided for dissipating heat from the electronic component. The heat dissipation device includes a plurality of metal fins for increasing a total heat exchanging area of the heat dissipation device, and a heat pipe for transferring heat from the electronic component to the fins. Each of the fins defines a through hole therein, with an annular flange extending outwardly from an outer periphery of the through hole towards a neighboring fin. When the fins are stacked, the flanges of the fins cooperatively form a columnar receiving space receiving the heat pipe therein. However, for facilitating receipt of the heat pipe in the receiving space of the fins, the through hole is often larger than the heat pipe, such that a gap exists between the flanges of the fins and the heat pipe after the heat pipe is received in the fins. The gap may reduce heat transfer between the heat pipe and the fins, thereby adversely affecting the heat dissipation efficiency of the heat dissipation device.

What is needed, therefore, is a heat dissipation device which can overcome the limitations described.

DETAILED DESCRIPTION

Figure 1:
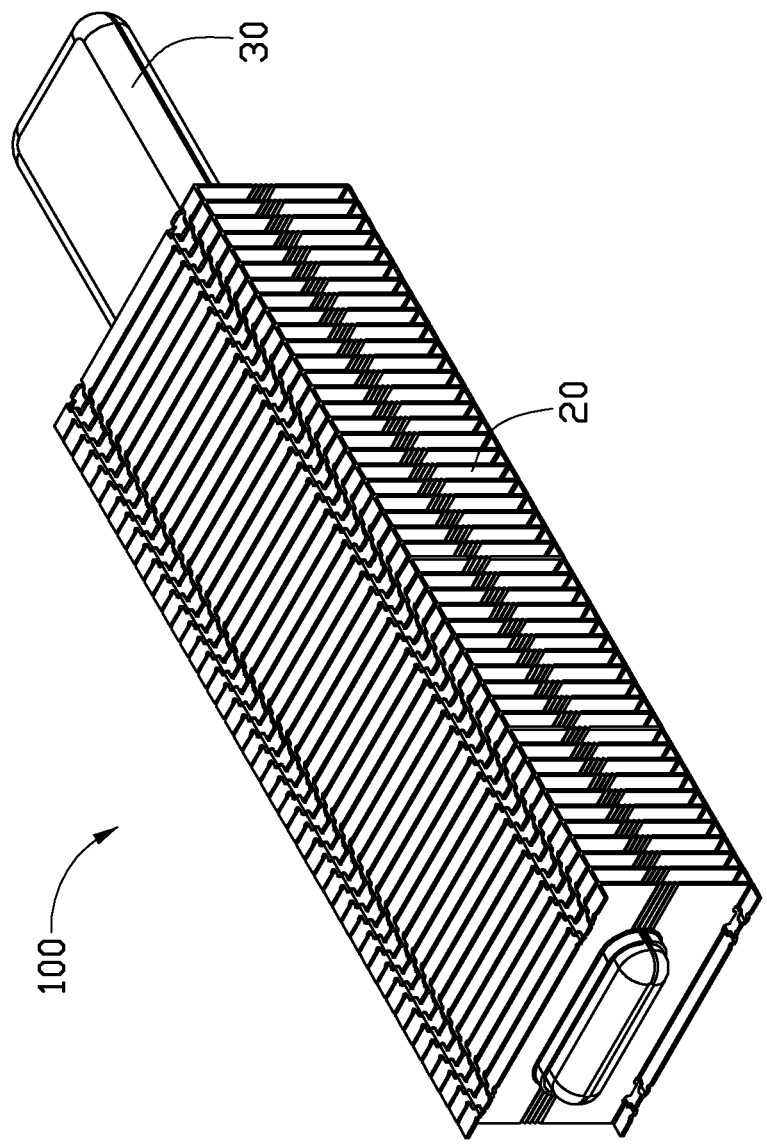
FIG. 1 is an isometric, assembled view of a heat dissipation device in accordance with a first embodiment of the present disclosure.

Referring to FIG. 1, a heat dissipation device 100 according to a first embodiment is shown. The heat dissipation device 100 includes a fin unit 20 and a heat pipe 30.

Figure 2:
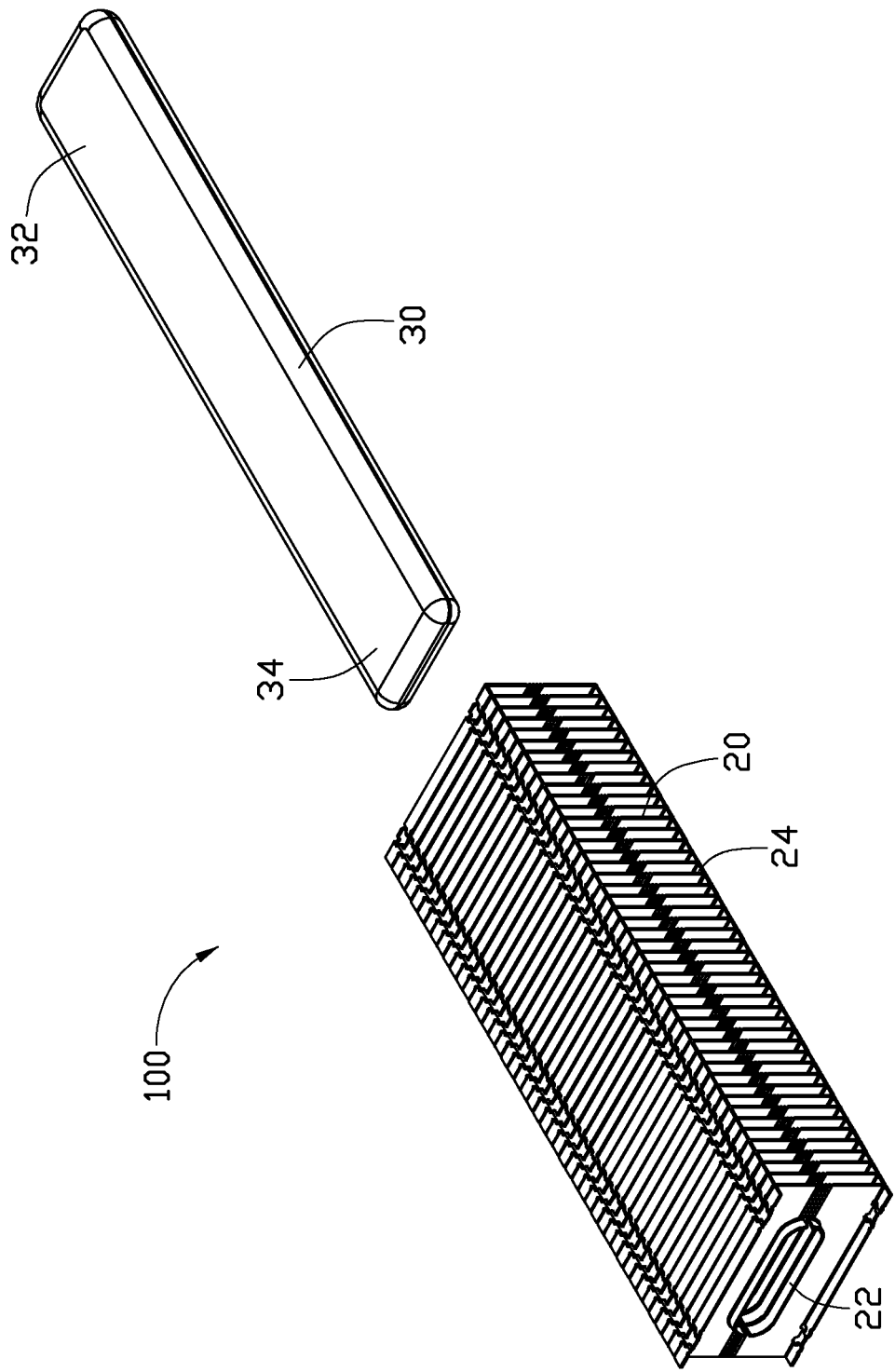
FIG. 2 is an exploded view of the heat dissipation device of FIG. 1.

Referring also to FIG. 2, in this embodiment, the heat pipe 30 is a flat-type heat pipe 30, with a width exceeding a height thereof. The heat pipe 30 includes an evaporation section 32 and a condensing section 34 respectively formed at opposite ends thereof. The evaporation section 32 is adapted for thermally contacting a heat generating component (not shown) to absorb heat generated by the heat generating component. The condensing section 34 is received in the fin unit 20 to transfer the heat absorbed from the heat generating component to the fin unit 20 for dissipation.

Figure 3:
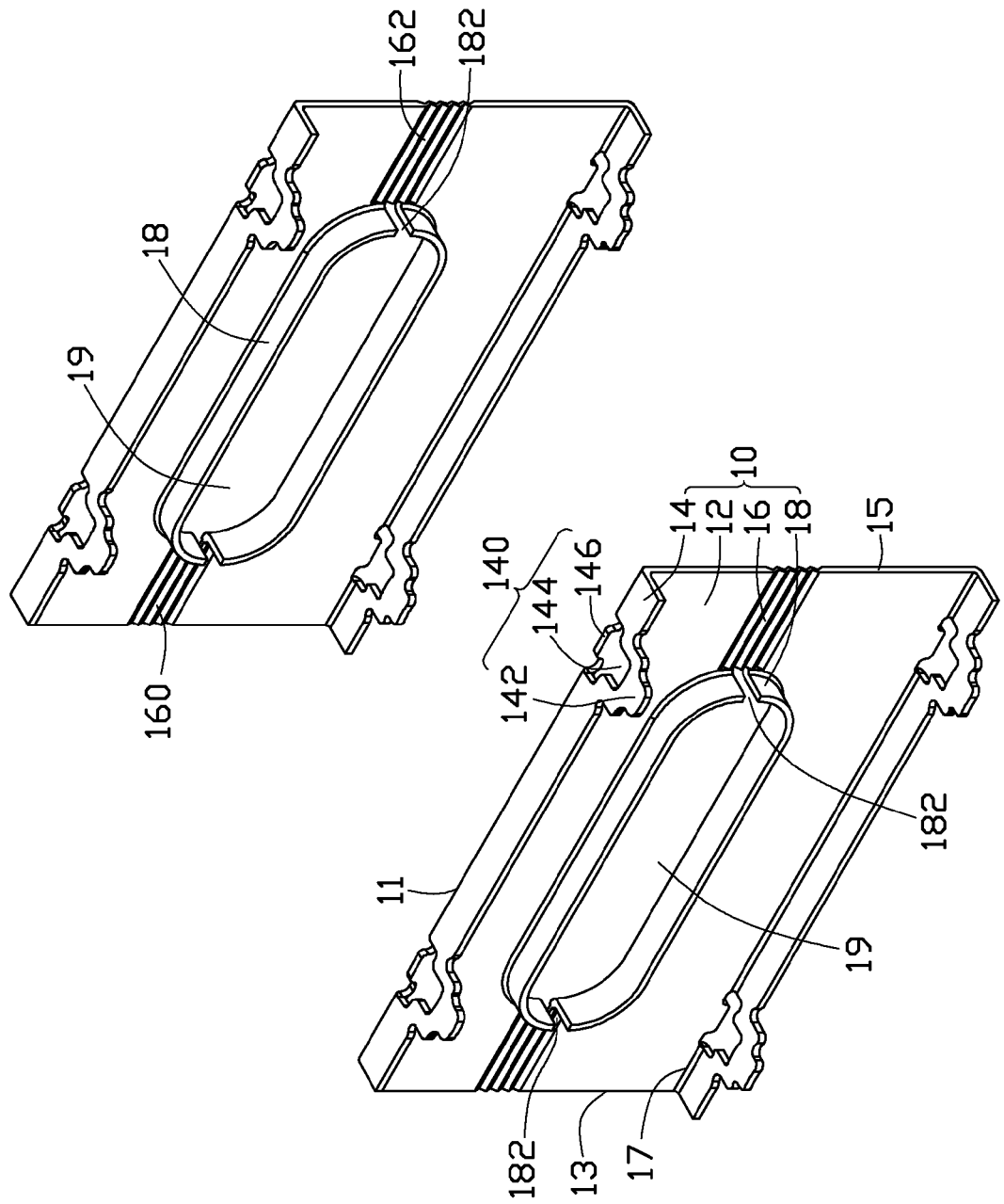
FIG. 3 is an enlarged, isometric view of two fins of the heat dissipation device of FIG. 1, showing the fins separated from each other.

The fin unit 20 includes a plurality of fins 10 stacked together. Each of the fins 10 is made of metal or metal alloy with a high heat conductivity coefficient, such as copper, aluminum, copper-alloy or aluminum-alloy. The fins 10 are parallel to and spaced from each other. A channel 24 is formed between each two neighboring fins 10. Referring also to FIG. 3, each of the fins 10 includes a main body 12, and a pair of ledges 14 bending from the main body 12. In this embodiment, the main body 12 is rectangular. The ledges 14 extend horizontally from a top side 11 and a bottom side 17 of the main body 12, respectively.

Two locking members 140 are formed on each of the ledges 14 to lock the fins 10 together. It is to be understood that the number and the position of the locking members 140 can be changed according to the size or the shape of the fin 10, so as to firmly combine the fins 10 together. Each locking member 140 includes an ear 142, a locking hole 144, and a locking tab 146. The ear 142 is approximately T-shaped, and extends horizontally outwards from an outer long side of the ledge 14. A width of the ear 142 as measured from the ledge 14 and extending in a direction away from the ledge 14 is approximately the same as a width of the ledge 14. The locking hole 144 is defined in the ledge 14, and is of substantially the same shape and size as the ear 142. Thus the locking hole 144 is approximately T-shaped, and receives the ear 142 of a corresponding neighboring fin 10. The locking tab 146 is formed at the junction of the main body 12 and the ledge 14, and corresponds to the locking hole 144 of the neighboring fin 10.

A through hole 19 is defined in a central portion of the main body 12 of each fin 10. A transverse cross-sectional shape of the through hole 19 is substantially the same as a transverse cross section of the condensing section 34 of the heat pipe 30, and a transverse cross-sectional size of the through hole 19 slightly exceeds a size of the transverse cross section of the condensing section 34 of the heat pipe 30. The through hole 19 in this embodiment is elongated along an axis parallel to the ledges 14 of the fin 10. The through hole 19 is generally rectangular, with two ends thereof respectively adjacent to left and right sides 13, 15 of the main body 12 of the fin 10 being curved. In the present embodiment, the two ends are semicircular. It should be understood that the shape of the through hole 19 can change according to a change in the shape of the heat pipe 30.

A flange 18 extends outwardly from a periphery of the through hole 19. A width of the flange 18 as measured from the main body 12 and extending in a direction perpendicularly away from the main body 12 is substantially equal to the width of each of the ledges 14 of the fins 10, and is uniform. A slit 182 is defined in each end of the flange 18. The slits 182 extend through the flange 18 and corresponding portions of the main body 12 at each end of the flange 18. The slits 182 are perpendicular to the main body 12, and communicate with the through hole 19. Thus the flange 18 is divided into two separated portions by the slits 182, with one of the portions being over the slits 182, and the other portion being under the slits 182.

The main body 12 forms a compressible structure 16 adjacent to the through hole 19. In this embodiment, the compressible structure 16 includes a first wave-shaped portion 160 and a second wave-shaped portion 162, both of which are aligned with the slits 182 of the flange 18. The first wave-shaped portion 160 is formed between the left side 13 of the main body 12 and the left end of the through hole 19, and the second wave-shaped portion 162 is formed between the right end of the through hole 19 and the right side 15 of the main body 12. Each of the first wave-shaped portion 160 and the second wave-shaped portion 162 includes a plurality of elongated peaks and troughs. Each of the peaks and troughs is horizontal, and the peaks and troughs are arranged alternately along a height direction of the main body 12. In the illustrated embodiment, each of the peaks is angular (sharp), and each of the troughs is angular. That is, each of the first and second wave-shaped portions 160, 162 is zigzagged. A thickness of each compressible structure 16 is less than that of other portions of the main body 12 of the fin 10.

In assembly of the fin unit 20, the fins 10 are stacked along a horizontal direction parallel to each other. The ledges 14 of a rearward fin 10 abut the top and bottom sides 11, 17 of the main body 12 of a neighboring forward fin 10, respectively. The ears 142 of each rearward fin 10 are received in the locking holes 144 of the neighboring forward fin 10, and engage with the locking tabs 146 of the neighboring forward fin 10. Thus the fins 10 are locked together. In such a state, the flange 18 of each rearward fin 10 contacts the main body 12 of the neighboring forward fin 10 at a periphery of the through hole 19, and accordingly the flanges 18 of the fins 10 cooperatively form a columnar receiving space 22 (see FIG. 2) for accommodating the condensing section 34 of the heat pipe 30 therein. Thus, the fin unit 20 is assembled.

Before assembly of the heat pipe 30 to the fin unit 20, a layer of tin solder (not shown) is spread on the condensing section 34 of the heat pipe 30. Since the size of the through holes 19 exceeds the size of the heat pipe 30, the heat pipe 30 with the tin solder is easily inserted through the through holes 19, and a narrow gap is defined between the flanges 18 and the condensing section 34 after the heat pipe 30 is received in the receiving space 22 of the fin unit 20. Then force can be applied to the assembly from above and below, to press the top and bottom ledges 14 of the fins 10. This causes the compressible structure 16 of each fin 10 to deform, thereby reducing a height of the compressible structure 16. Since the flange 18 has the slits 182 formed therein, the portion of the flange 18 over the slits 182 can move downward and the other portion of the flange 18 under the slits 182 can move upward to contact the heat pipe 30 closely when the compressible structure 16 is compressed to reduce the height thereof. Finally, the heat pipe 30 can be soldered to closely combine with the flanges 18 of the fins 10 of the fin unit 20. Typically, the flanges 18 of the fins 10 of the fin unit 20 intimately contact the heat pipe 30. Thus heat conduction between the heat pipe 30 and the fins 10 is enhanced, and accordingly, the heat dissipation efficiency of the heat dissipation device 100 is improved. Intimate contact of the heat pipe 30 and the fins 10 may even be achieved without soldering.

Figure 4:
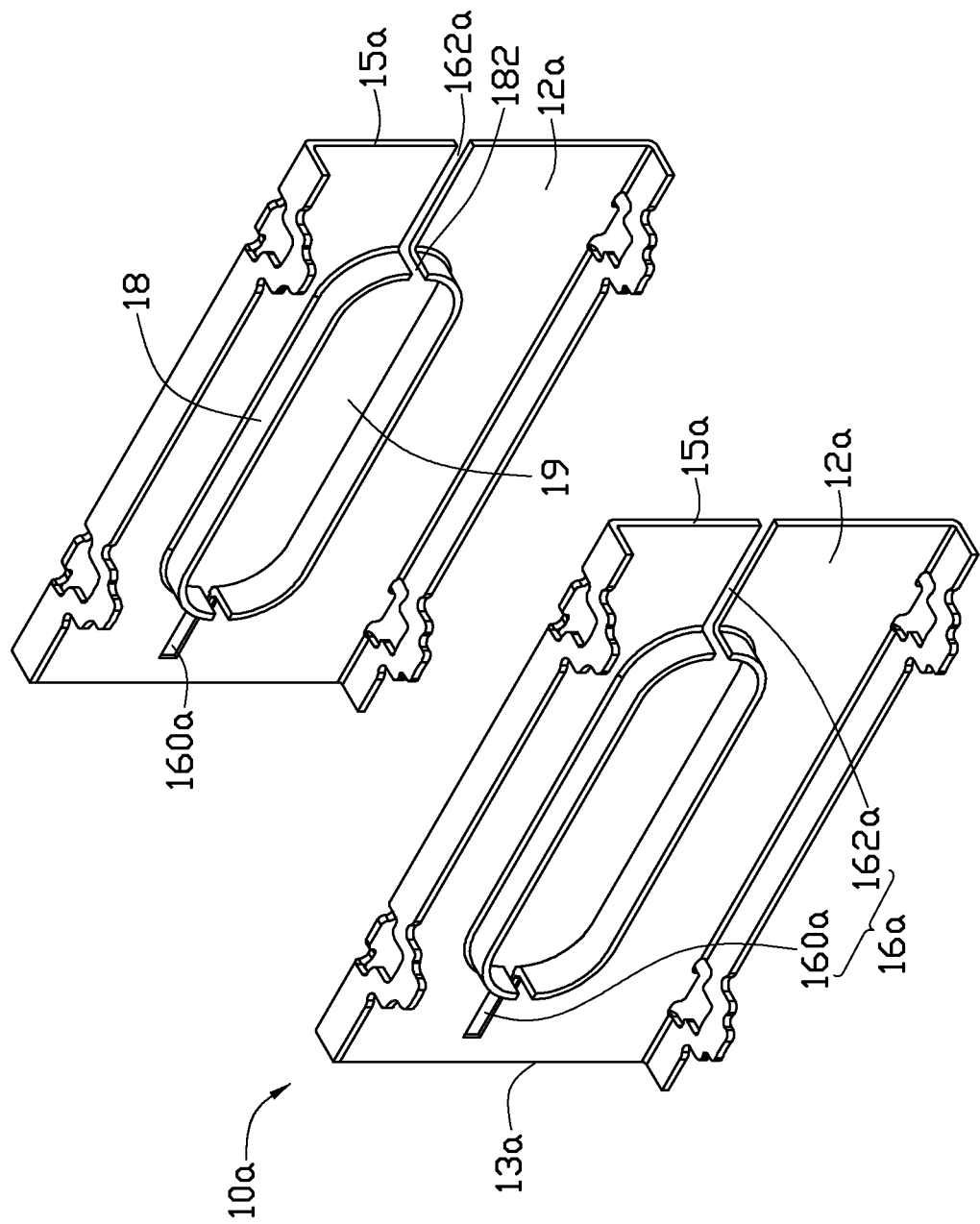
FIG. 4 is similar to FIG. 3, but shows two separated fins of a heat dissipation device in accordance with a second embodiment of the present disclosure.

FIG. 4 shows two separated fins 10a of a heat dissipation device according to a second embodiment, differing from the previous embodiment only in a compressible structure 16a of each of fins 10a. In this embodiment, the compressible structure 16a includes a first groove 160a and a second groove 162a. The first groove 160a, the second groove 162a, and the slits 182 of the flange 18 are collinear. The first groove 160a communicates with the slit 182 at the left end of the through hole 19, and extends horizontally from the left end of the through hole 19 a predetermined distance. The predetermined distance is less than the distance between the left end of the through hole 19 and a left side 13a of the fin 10a. That is, the first groove 160a is a blind groove that does not reach all the way to the left side 13a of the fin 10a. The second groove 162a communicates with the slit 182 at the right end of the through hole 19, and extends horizontally from the right end of the through hole 19 through to a right side 15a of the main body 12a. That is, the second groove 162a is a through groove. Accordingly, when the compressible structure 16a of the fin 10a sustains a force along the height direction thereof, the two portions of the flange 18 at the opposite sides of the slits 182 can move towards each other to closely contact the heat pipe 30 and enhance heat transfer therebetween.

Figure 5:
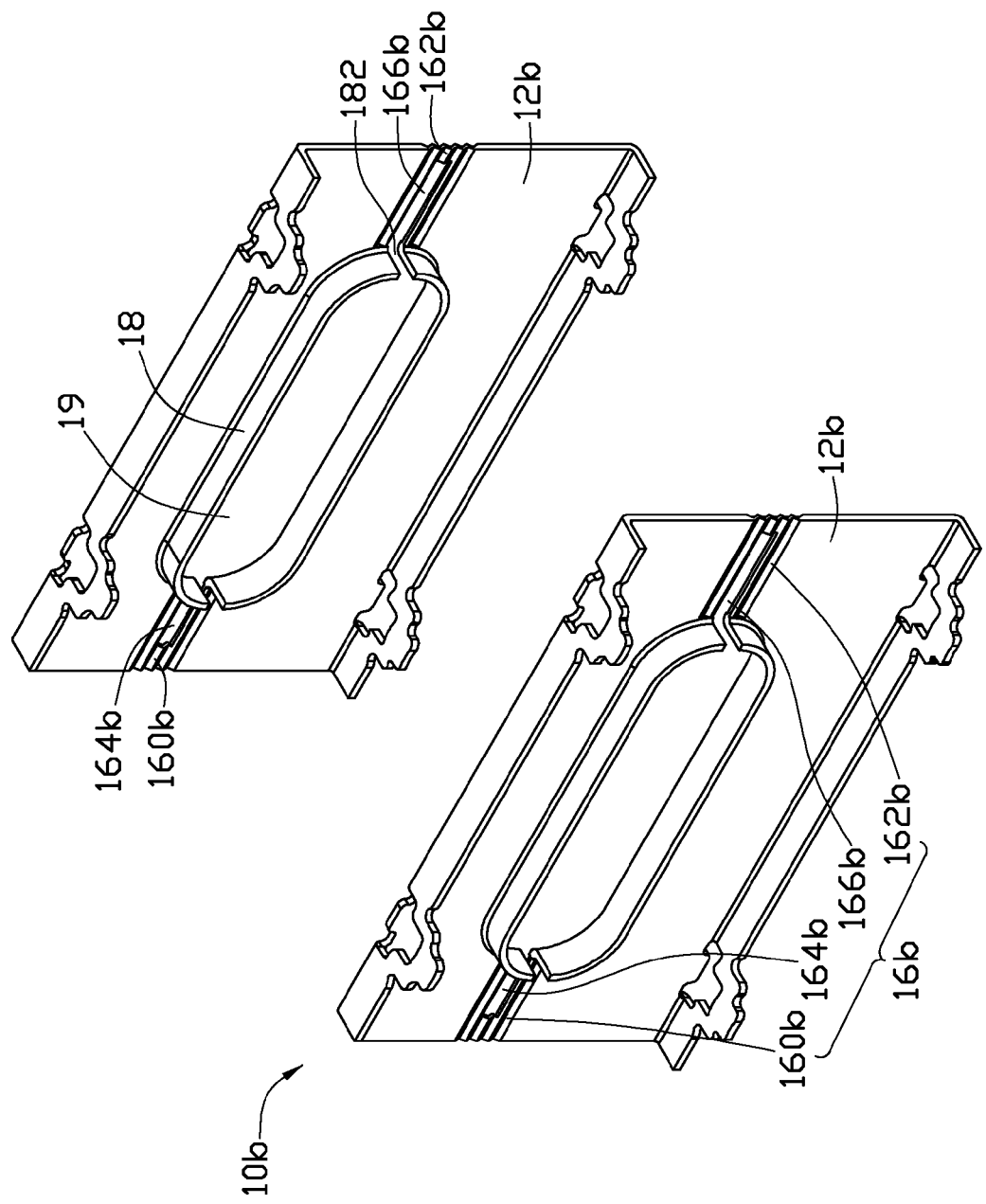
FIG. 5 is similar to FIG. 3, but shows two separated fins of a heat dissipation device in accordance with a third embodiment of the present disclosure.

FIG. 5 shows two separated fins 10b of a heat dissipation device according to a third embodiment. In this embodiment, each fin 10b forms a compressible structure 16b thereon. The compressible structure 16b includes a first wave-shaped portion 160b and a second wave-shaped portion 162b, which are similar to the first wave-shaped portion 160 and the second wave-shaped portion 162 of the first embodiment. The difference is that a first slot 164b is defined in the first wave-shaped portion 160b, and a second slot 166b is defined in the second wave-shaped portion 162b. Both the first slot 164b and the second slot 166b extend horizontally, and communicate with the respective slits 182 of the flange 18. In this embodiment, the first slot 164b does not extend all the way through the first wave-shaped portion 160b, and the second slot 166b does not extend all the way through the second wave-shaped portion 162b. That is, each of the first and second slots 164b, 166b is a blind slot. Accordingly, when the compressible structure 16b of the fin 10b sustains a force along the height direction thereof, the two portions of the flange 18 at the opposite sides of the slits 182 can move towards each other to closely contact the heat pipe 30 and enhance heat transfer therebetween.

It is to be understood, however, that even though numerous characteristics and advantages of certain embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation device, comprising:
a heat pipe comprising an evaporation section adapted for absorbing heat and a condensing section; and
a fin unit comprising a plurality of stacked parallel fins, each of the fins comprising:
a through hole, a flange extending around the periphery of the through hole, the flange defining two opposite slits to divide the flange into two separate portions, the slits communicating with the through hole, a uniform main body located above and below the through hole, a compressible structure comprising: a first waved shaped portion located on a first side of the through hole and a second wave shaped portion located on a second side of the through hole, opposite the first side, the compressible structure being aligned with the slits and located between the uniform main body located above and below the through hole, the first wave shaped portion and the second wave shaped portion each being zigzagged and comprising a plurality of elongated peaks and elongated troughs arranged alternatively along a compression direction between the uniform main body located above and below the through hole, a first slot defined in the first waved shaped portion, communicating with the through hole and a second slot defined in the second waved shaped portion, communicating with the through hole, wherein the condensing section of the heat pipe is received in the through hole, and the compressible structure of each of the fins, are compressed such that the fins closely contact the condensing section of the heat pipe.

2. The heat dissipation device of claim 1, wherein the compressible structure comprises two wave-shaped portions formed at the opposite sides of the through hole, respectively.

3. The heat dissipation device of claim 2, wherein the compressible structure of each fin is thinner than other portions of the fin.

4. The heat dissipation device of claim 2, wherein the first waved shaped portion and the second waved shaped portion extend from the through hole to one corresponding lateral side of the fin along a direction perpendicular to the compressed direction of the compressible structure.

5. The heat dissipation device of claim 4, wherein the compressible structure further comprises two slots respectively defined in the first and second wave-shaped portions, and a length of the each of the slots along the direction perpendicular to the compressed direction of the compressible structure is less than that of the corresponding wave-shaped portion.

6. The heat dissipation device of claim 1, wherein the fins closely contact the condensing section of the heat pipe via a solder coating on the condensing section of the heat pipe.

7. A heat dissipation device, comprising:
a heat pipe comprising an evaporation section and a condensing section formed at opposite ends thereof, respectively; and
a fin unit comprising a plurality of stacked parallel fins, each of the fins comprising:
a through hole defined therein for receiving the condensing section of the heat pipe;
a flange extending from the periphery of the through hole, the flange defining two opposite slits to divide the flange into two separate portions, the slits communicating with the through hole;
a uniform main body located above and below the through hole,
and
a compressible structure comprising: a first waved shaped portion located on a first side of the through hole and a second wave shaped portion located on a second side of the through hole, opposite the first side, the compressible structure being aligned with the slits and located between the uniform main body located above and below the through hole, the first wave shaped portion and the second wave shaped portion each being zig-zagged and comprising a plurality of elongated peaks and elongated troughs arranged alternatively along a compression direction between the uniform main body located above and below the through hole, a first slot defined in the first waved shaped portion, communicating with the through hole and a second slot defined in the second waved shaped portion, communicating with the through hole, wherein the condensing section of the heat pipe is received in the through hole, and the compressible structure of each of the fins, are compressed along a direction transverse to the alignment with the slits, the compressive structure is compressed and the separate portions of the flange move towards each other and closely contact the condensing section of the heat pipe.

8. The heat dissipation device of claim 7, wherein the through hole of each fin is larger than a cross section of the condensing section of the heat pipe to facilitate receipt of the condensing section of the heat pipe in the through hole prior to compression of the compressible structure.

9. The heat dissipation device of claim 8, wherein the compressible structure is thinner than other portions of the fin.

10. The heat dissipation device of claim 8, wherein the compressible structure further comprises two slots respectively defined in the two wave-shaped portions and communicating with the through hole, and a length of each of the slots along the alignment direction is less than that of the corresponding wave-shaped portion.

* * * * *